United States Patent [19]
Cromwell

[11] Patent Number: 6,084,178
[45] Date of Patent: Jul. 4, 2000

[54] PERIMETER CLAMP FOR MOUNTING AND ALIGNING A SEMICONDUCTOR COMPONENT AS PART OF A FIELD REPLACEABLE UNIT (FRU)

[75] Inventor: S. Daniel Cromwell, Roseville, Calif.

[73] Assignee: Hewlett-Packard Company, Palo Alto, Calif.

[21] Appl. No.: 09/032,359

[22] Filed: Feb. 27, 1998

[51] Int. Cl.[7] .................................................. H05K 9/00
[52] U.S. Cl. ..................... 174/35 R; 174/16.3; 174/52.1; 361/719; 361/704; 29/447; 29/525.01
[58] Field of Search ............................. 174/16.3, 35 R, 174/52.1; 361/719, 704; 29/447, 525.01

[56] References Cited

U.S. PATENT DOCUMENTS

| | | | |
|---|---|---|---|
| 4,067,237 | 1/1978 | Arcella | 73/204 |
| 4,120,019 | 10/1978 | Arii et al. | 361/385 |
| 4,167,031 | 9/1979 | Patel | 361/388 |
| 4,342,069 | 7/1982 | Link | 361/401 |
| 4,376,560 | 3/1983 | Olsson et al. | 339/17 CF |
| 4,506,938 | 3/1985 | Madden | 339/17 CF |
| 4,540,226 | 9/1985 | Thompson et al. | 339/17 |
| 4,563,383 | 1/1986 | Kuneman et al. | 428/216 |
| 4,589,716 | 5/1986 | Williams, II | 339/91 R |
| 4,638,854 | 1/1987 | Noren | 165/76 |
| 4,675,783 | 6/1987 | Murase et al. | 361/385 |
| 4,707,726 | 11/1987 | Tinder | 357/81 |

(List continued on next page.)

OTHER PUBLICATIONS

HP PDNO: 10970218 "A Heat Sink And Faraday Cage Assembly For A Semiconductor Module And A Power Converter." Filed: Jul. 30, 1997, Serial No. 08/902,770, pp. 1–17, Figs. 1–6.

HP PDNO: 10971839, "Method And Apparatus For Modular Integrated Apparatus For Heat Dissipation." Filed: Nov. 18, 1998, Ser. No. 09/195256, pp. 1–27, Figs. 1–4.

HP PDNO: 10971840–1, "Method And Apparatus For A Modular Integrated Apparatus For Multi–Function Components." Filed: Oct. 29, 1998, Serial No. 09/182939, pp. 1–35, Figs. 1–4.

MASCO Electronics–Spira, "Inspiration—The Better EMI Gasket," (visited Oct. 29, 1998) <http://www.masco–electronics.com/spira.shtm> pg. 1 of 1.

S.A. Curtis, et al., "Surface Mount Chip Packaging", IBM Technical Disclosure Bulletin, vol. 28—No. 12, May 1986, pp. 5531–5532.

S.W. Lee, et al., "Low Profile Heat Sink", IBM Technical Disclosure Bulletin, vol. 28—No. 12, May 1986, pp. 5172–5173.

F.J. DeMaine et al., "Attachable Heat Sink For Pluggable Modules", IBM Technical Disclosure Bulletin, vol. 22—No. 3, Aug. 1979, pp. 960–961.

*Primary Examiner*—William A. Cuchlinski, Jr.
*Assistant Examiner*—Ronnie Mancho

[57] ABSTRACT

A package for heat sinks and semiconductor components that adequately dissipates heat from semiconductor components without damaging or bending the semiconductor component electrical grid terminals and without imposing mechanical stress on the semiconductor component. The package includes both the heat sink and the semiconductor component situated in one unit that minimizes the thermal path. The heat sink and semiconductor component package may be packaged in a field replaceable unit (FRU) and may act as a handle for use in its own replacement. The FRU contains the heat sink and the semiconductor component in one unit, and thereby enables safe, simplified, and cost effective maintenance, including removal and addition of the semiconductor components, outside of the manufacturing environment. The package further includes a docking assembly mounted on a printed circuit board that orients and positions the FRU to align the semiconductor component and the electrical grid terminals for insertion on the printed circuit board.

8 Claims, 3 Drawing Sheets

U.S. PATENT DOCUMENTS

| | | | |
|---|---|---|---|
| 4,829,432 | 5/1989 | Hershberger et al. | 361/424 |
| 4,858,093 | 8/1989 | Sturgeon | 363/20 |
| 4,874,318 | 10/1989 | Spencer | 439/71 |
| 4,951,740 | 8/1990 | Peterson et al. | 165/32 |
| 4,961,633 | 10/1990 | Ibrahim et al. | 350/392 |
| 4,975,825 | 12/1990 | Huss et al. | 363/141 |
| 4,978,638 | 12/1990 | Buller et al. | 437/209 |
| 5,010,292 | 4/1991 | Lyle, Jr. | 323/274 |
| 5,060,112 | 10/1991 | Cocconi | 361/386 |
| 5,118,925 | 6/1992 | Mims et al. | 250/213 VT |
| 5,131,859 | 7/1992 | Bowen et al. | 439/194 |
| 5,136,119 | 8/1992 | Leyland | 174/35 R |
| 5,162,974 | 11/1992 | Currie | 361/385 |
| 5,208,731 | 5/1993 | Blomquist | 361/386 |
| 5,229,915 | 7/1993 | Ishibashi et al. | 361/385 |
| 5,276,585 | 1/1994 | Smithers | 361/704 |
| 5,307,239 | 4/1994 | McCarty et al. | 361/704 |
| 5,311,395 | 5/1994 | McGaha et al. | 361/720 |
| 5,311,397 | 5/1994 | Harshberger et al. | 361/683 |
| 5,313,099 | 5/1994 | Tata et al. | 257/717 |
| 5,329,426 | 7/1994 | Villani | 361/719 |
| 5,339,214 | 8/1994 | Nelson | 361/695 |
| 5,359,768 | 11/1994 | Haley | 29/840 |
| 5,367,193 | 11/1994 | Malladi | 257/707 |
| 5,386,338 | 1/1995 | Jordan et al. | 361/704 |
| 5,387,554 | 2/1995 | Liang | 257/675 |
| 5,394,607 | 3/1995 | Chiu et al. | 29/827 |
| 5,398,822 | 3/1995 | McCarthy et al. | 211/41 |
| 5,428,897 | 7/1995 | Jordan et al. | 257/675 |
| 5,436,800 | 7/1995 | Maruska et al. | 361/752 |
| 5,442,234 | 8/1995 | Liang | 437/209 |
| 5,460,571 | 10/1995 | Kato et al. | 454/184 |
| 5,461,541 | 10/1995 | Wentland, Jr. et al. | 361/707 |
| 5,461,766 | 10/1995 | Burward-Hoy | 29/447 |
| 5,475,606 | 12/1995 | Muyshondt et al. | 364/489 |
| 5,487,673 | 1/1996 | Hurtarte | 439/69 |
| 5,502,622 | 3/1996 | Cromwell | 361/807 |
| 5,504,650 | 4/1996 | Katsui et al. | 361/697 |
| 5,506,758 | 4/1996 | Cromwell | 361/798 |
| 5,508,908 | 4/1996 | Kazama et al. | 363/141 |
| 5,513,070 | 4/1996 | Xie et al. | 361/700 |
| 5,522,602 | 6/1996 | Kaplo et al. | 277/53 |
| 5,548,481 | 8/1996 | Salisbury et al. | 361/709 |
| 5,558,522 | 9/1996 | Dent | 439/65 B |
| 5,579,982 | 12/1996 | Chung | 165/80.3 |
| 5,586,005 | 12/1996 | Cipolla et al. | 361/719 |
| 5,587,883 | 12/1996 | Olson et al. | 361/723 |
| 5,587,920 | 12/1996 | Muyshondt et al. | 364/489 |
| 5,592,366 | 1/1997 | Goldman et al. | 361/796 |
| 5,592,391 | 1/1997 | Muyshondt et al. | 364/489 |
| 5,598,320 | 1/1997 | Toedtman et al. | 361/687 |
| 5,621,635 | 4/1997 | Takiar | 363/141 |
| 5,640,304 | 6/1997 | Hellinga et al. | 361/707 |
| 5,641,995 | 6/1997 | Sloma et al. | 257/783 |
| 5,662,163 | 9/1997 | Mira | 165/80.3 |
| 5,722,839 | 3/1998 | Yeh | 439/79 |
| 5,766,031 | 6/1998 | Yeh | 439/328 |
| 5,808,236 | 9/1998 | Brezina et al. | 174/16.3 |

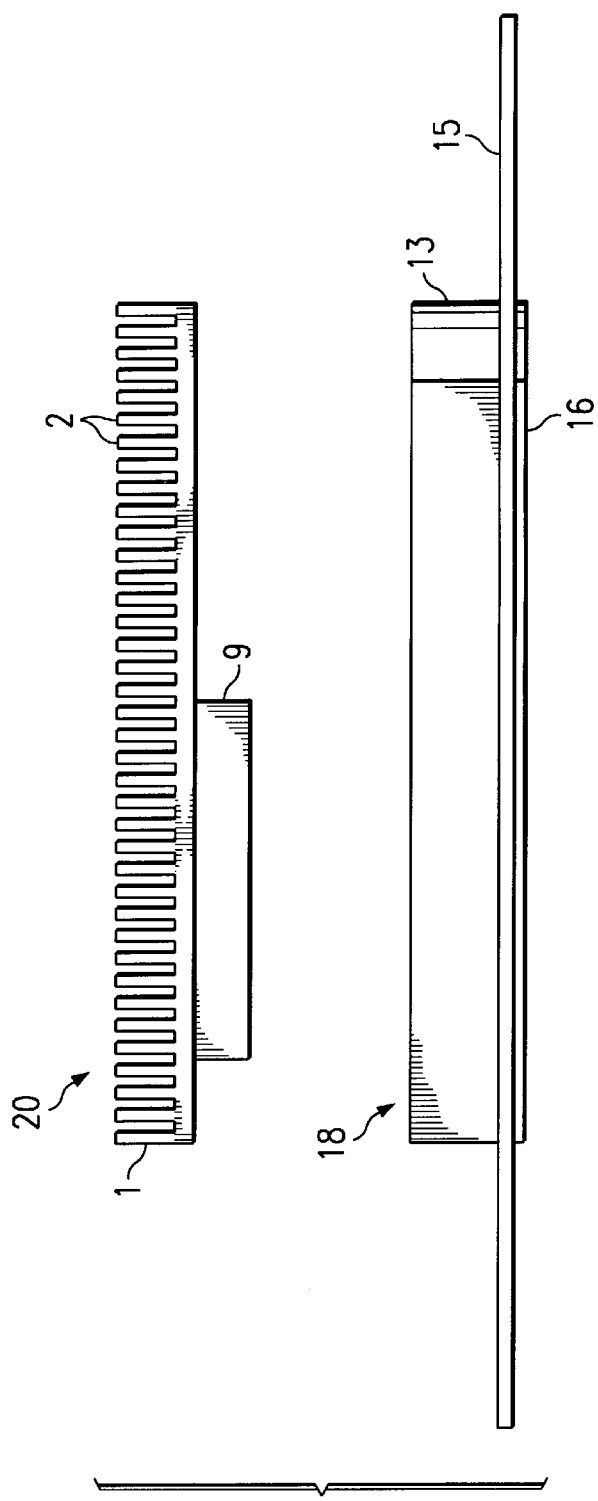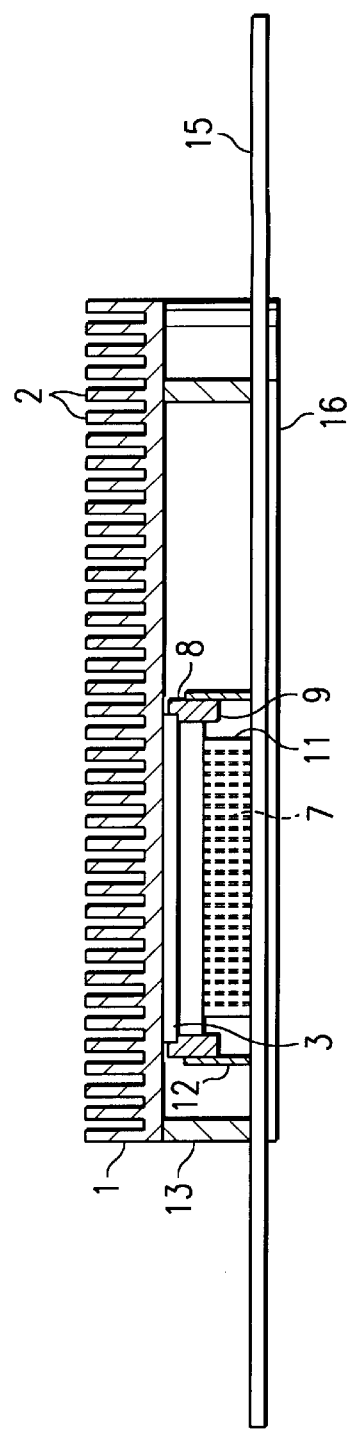

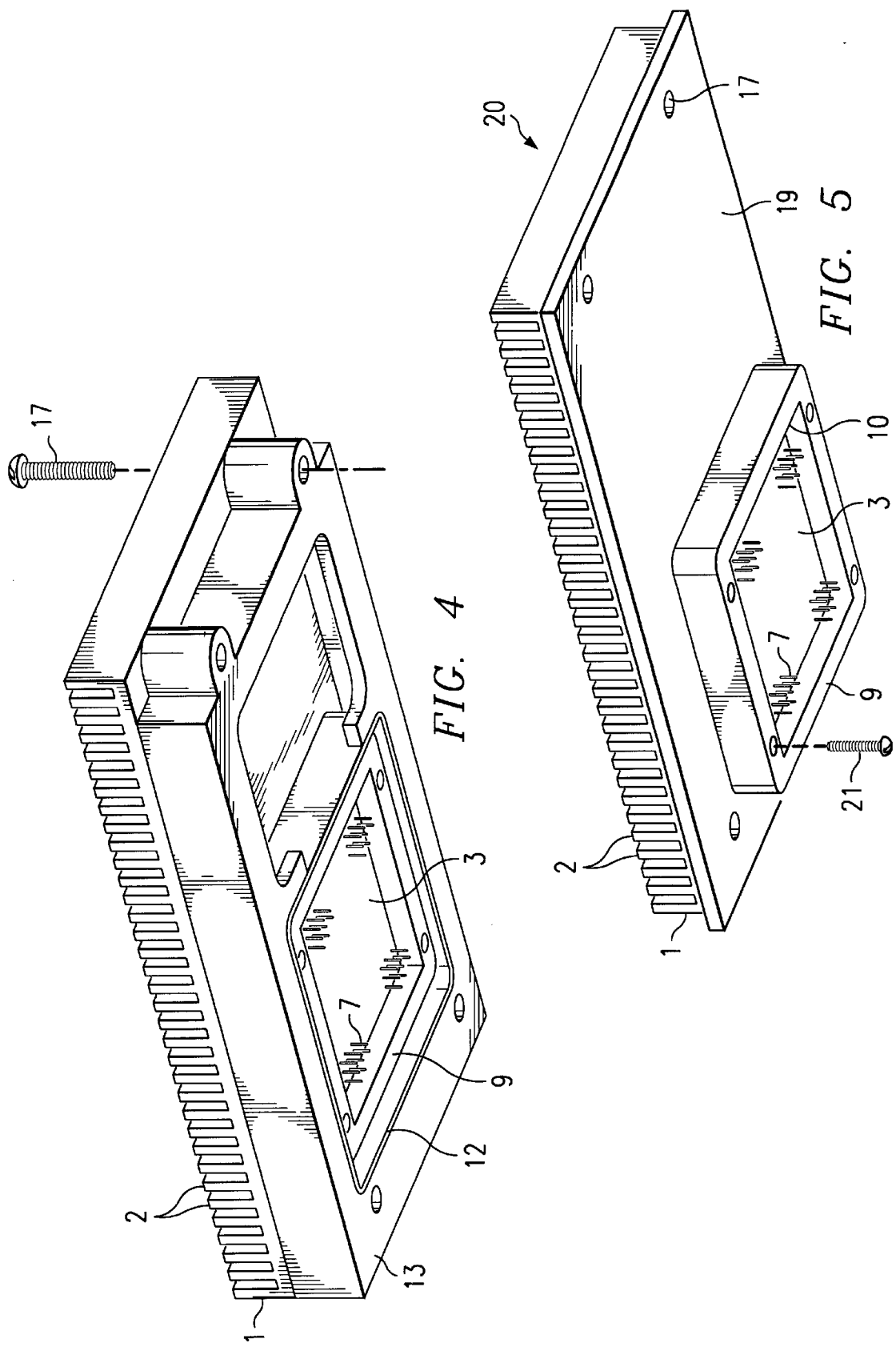

6,084,178

PERIMETER CLAMP FOR MOUNTING AND ALIGNING A SEMICONDUCTOR COMPONENT AS PART OF A FIELD REPLACEABLE UNIT (FRU)

FIELD OF THE INVENTION

The present invention relates generally to integrated circuit packaging. More particularly, but not by way of limitation, the present invention relates to packaging heat dissipation devices with semiconductor components into field replaceable units, while reducing the mechanical stress on the semiconductor components.

BACKGROUND OF THE INVENTION

As the state of development of semiconductor components has moved to increased levels of integration, the amount of heat these devices generate has significantly increased. Components handling large quantities of electrical current such as semiconductor components generate large amounts of heat. If this heat is not adequately removed, the increased temperatures generated by the semiconductor components will damage the components.

One approach for solving the heat dissipation problem is to attach components which transfer or dissipate heat by means of heat sinks, including heat dissipation plates, fin stacks, and heat pipes, to semiconductor components. It will be appreciated that the use of the term heat sink herein includes all forms of heat dissipation devices such as fins and heat pipes. As semiconductor components get increasingly hotter, the heat dissipation devices required to cool these components likewise get larger and heavier. Both the increased size and weight of the heat sink add a risk of mechanical damage to the semiconductor component.

Heat sinks are commonly attached to semiconductor components by means of springs or clamps. Thus, the semiconductor component and the heat sink are treated as separate parts of a system. The heat sink and the semiconductor component must be fitted together with a thermal enhancer, such as a thermal pad or thermal grease, to create a low resistance thermal path to ensure a proper operating temperature for the semiconductor component. Computer systems often include multi-way computer (CPU) architectures which increase the need to add, to upgrade, or to replace semiconductor components to the computer system. Changing the semiconductor components is often done outside of the controlled manufacturing environment. The increased handling of semiconductor components increases the risk of interrupting the tightly controlled, factory installed thermal interface between the semiconductor components and the heat sink. Furthermore, in these systems access to the semiconductor component is very difficult due to the size and crowding of the heat sinks. These problems require field replaceable units with optimized thermal paths that are not interrupted in the repair or upgrade process.

As heat sinks continue to increase significantly in size and weight to accommodate the increase of heat from semiconductor components the risk of damage to the semiconductor components due to mechanical overloading is increased. Therefore, there is an increasing need to distribute the force that is created by the heat sink on the semiconductor component to minimize load conditions that could damage the semiconductor component. By way of example, the need to minimize mechanical overloading is important as mechanical overloading can cause failure of the semiconductor component.

When the semiconductor component and the heat dissipation component are handled as separate parts of a system, more particularly when the heat dissipation device must be subsequently added to the system, both more thermal and mechanical design margin are required to accommodate attachment of the independent parts. For instance, proper insertion of the semiconductor component requires accurate location and orientation of the semiconductor component with respect to the PCB, and when safe extraction of a semiconductor component is necessary typically a special tool applied with a large amount of force is required and this is especially difficult to do at a customer site without a controlled factory environment. Also, factors such as the increased integration levels that increase the electrical connections on the semiconductor component; and the separate semiconductor component and heat dissipation component both increase the need for accurate alignment of the electrical connections on the printed circuit board. Further, the increased handling, transport, and use of the semiconductor component caused by the separate component design may increase the risk of bending or otherwise damaging the area grid array on a semiconductor package. Also, treating the semiconductor package and the heat sink separately precludes early testing of the semiconductor package and the heat sink which cannot be finally tested until they are assembled together.

As will be appreciated by those skilled in the art, achieving sufficient thermal interface between the semiconductor component and the heat dissipation component requires applying a thermal interface enhancing material such as, but not limited to, a thermal pad or grease. Successful application of a thermal interface enhancing material requires a flat, clean surface to ensure a tight thermal interface between the semiconductor component and the heat dissipation component, and it is difficult to create an adequate thermal interface outside of the manufacturing environment. Therefore, when the semiconductor component and the heat dissipation component are handled as separate parts of a system, successful replacement of either component outside of the manufacturing environment is more difficult.

From the foregoing it will be apparent that there is still a need for a way to package heat sinks that adequately dissipate heat from semiconductor components, without damaging or bending the semiconductor component area grid array to ensure correct connection of the area grid array to the printed circuit board by connectors, and without imposing mechanical stress on the semiconductor component that can lead to failure. There is also still a need for packaging heat sinks and semiconductor components to enable safe maintenance of the semiconductor components, including removal and addition of semiconductor components outside of the manufacturing environment.

SUMMARY OF THE INVENTION

The present invention is an apparatus and a method for combining heat sinks and semiconductor components that adequately dissipate heat from the semiconductor components; without damaging or bending the semiconductor component electrical grid terminals and without imposing mechanical stress on the semiconductor component. Since mechanical stress can lead to failure of the semiconductor component the present invention can advantageously improve component reliability. The present invention is a package that includes both the heat sink and the semiconductor component assembled in a field replaceable unit that optimizes the thermal path between the semiconductor component and the heat sink; that electrically connects the semiconductor component to a printed circuit board (PCB) through standard techniques; and that enables docking of the field replaceable unit on the printed circuit board; without interrupting the thermal interface created in a manufacturing environment.

The semiconductor component typically includes a substrate and the leads, or electrical grid terminals, of a VLSI die are attached to the substrate. The semiconductor component may be connected to the PCB by attaching the electrical grid terminals of the semiconductor component to electrical contacts in a connector on the PCB. The semiconductor component may be a central processing unit (CPU).

In the present invention the FRU may advantageously act as a handle for use in its own replacement. Further, the single unit FRU may enable safe maintenance including removal and addition of the semiconductor components outside of the manufacturing environment. By producing the FRU as one unit in the controlled manufacturing environment, final testing of the assembled heat sink and the semiconductor component can be completed in the manufacturing environment. Additionally, the present invention simplifies the maintenance of semiconductor components and enables a maintenance cost savings over past packaging designs that mounted the heat sink subsequent to the semiconductor component. The single unit FRU may also minimize the length of traces between electronic packages in a computer system by enabling the use of a tall FRU design with a minimum printed circuit board footprint, or surface area. This improves the performance of the overall system.

The present invention includes an FRU that may be created by a frame or other nonthermal component that attaches to the semiconductor component and that is used in conjunction with a heat sink. For example, the heat sink may be framed by a housing that is included in the FRU. The advantageous features of the FRU, including acting as a handle for use in its own replacement and enabling maintenance cost savings over past packaging designs, are not limited to the inclusion of the heat sink in the FRU and may be realized by the use of a non-thermal component in place of or along with the heat sink.

The semiconductor component may be a VLSI package that is layered on a substrate base. The VLSI package may include a lid that overhangs the substrate base around the substrate base perimeter to enable proper thermal attachment of the VLSI package on the FRU. The VLSI package may be attached to electrical grid terminals, such as an area grid array.

The heat sink and semiconductor component package according to the invention includes a field replaceable unit produced by mounting a heat sink directly on a semiconductor component and the field replaceable unit may be connected to the PCB. The present invention may include a mounting assembly created by a docking housing mounted on the PCB. The FRU and the mounting assembly may cooperate to ensure that the semiconductor component package is correctly located and oriented above the connector on the PCB and that the FRU mechanical load is absorbed by the mounting assembly. More particularly the present invention may include an anchor bracket as part of the mounting assembly which may be mounted on the printed circuit board and act as a docking assembly for the heat sink and the semiconductor component package. The attachment of the FRU to the anchor bracket docking assembly may provide stability to the PCB; and may reduce mechanical load away from the area grid array and the VLSI package, and onto the anchor bracket docking assembly and thereby may protect the area grid array from system-level handling damage. The mounting assembly may optionally include a bolster plate that is attached to the PCB and that provides stability to the PCB. In the present invention, the PCB may advantageously be sandwiched between the anchor bracket docking assembly and the bolster plate and thereby may enhance the rigidity and the stability of the PCB.

The invention preferably includes an anchor bracket that attenuates electromagnetic interference (EMI) emissions. The anchor bracket may be made of EMI attenuating material and may also be grounded to the heat sink to thereby provide a Farday Cage that enhances EMI containment for the area grid array and the VLSI package. Those skilled in the art will appreciate that a Faraday Cage attenuates EMI emission.

The perimeter clamp includes alignment surfaces that cooperate with alignment surfaces on the anchor bracket to ensure the correct positioning and orientation of the VLSI package on the printed circuit board, by aligning the VLSI package to successfully insert the area grid array into the connector on the printed circuit board. It will be appreciated that portions of the FRU other than the perimeter clamp, such as the heat sink, may include alignment surfaces that may cooperate with the alignment surfaces on the anchor bracket.

Advantageously, the present invention may include a perimeter clamp that may be attached to the heat sink, to ensure a thermal interface between the heat sink and the VLSI package that suitably dissipates heat from the VLSI package. Preferably in the present invention, the edges of the perimeter clamp may be attached to the heat sink via attachment devices such as screws, and the perimeter clamp edges may surround the VLSI package. The surrounding edges more particularly, may be recessed and the VLSI package lid overhang may fit into the recessed perimeter clamp edges, creating a tight thermal interface between the heat sink and the VLSI package as well as creating a secure fit for the VLSI package in the FRU. The secure fit for the VLSI package in the FRU does not apply clamping loads on the electrical portion of the VLSI package lid.

Other aspects and advantages of the present invention will become apparent from the following detailed description, taken in conjunction with the accompanying drawings illustrating by way of example the principles of the invention.

BRIEF DESCRIPTION OF THE DRAWINGS

FIG. 1 is a side view of the FRU just prior to its insertion into the anchor bracket and the printed circuit board;

FIG. 3 is a section view of the perimeter clamp aligning with the anchor bracket via the alignment surfaces of the perimeter clamp and the alignment surfaces of the anchor bracket, and the connection of the electrical grid array to the printed circuit board;

FIG. 4 is a bottom view of the heat sink and the anchor bracket that cooperate with the perimeter clamp; and FIG. 5 is a bottom view of the heat sink and the perimeter clamp and shows the handle function of the field replaceable unit.

DESCRIPTION OF THE PREFERRED EMBODIMENTS

Figure 2:
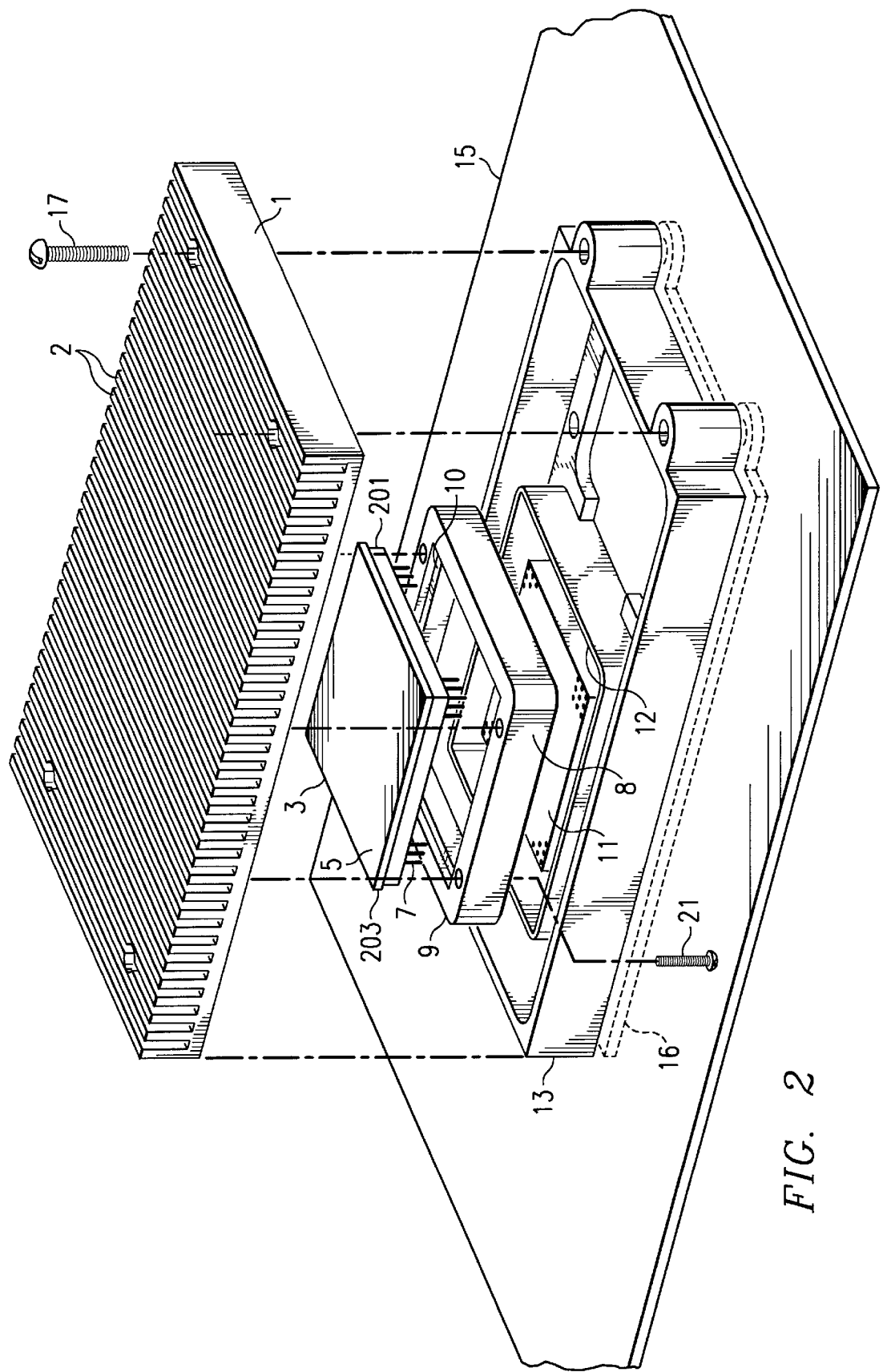
FIG. 2 is an exploded view of the field replaceable unit and the printed circuit board with the docking assembly and includes a top view of the semiconductor component (VLSI package) with the lid overhanging the substrate base.

As shown in the drawings and for purposes of illustration, the present invention is embodied in a novel package that creates a field replaceable unit by mounting a heat sink on a semiconductor component. The field replaceable unit design minimizes the thermal path between the heat sink and the semiconductor component. The mounting package further includes a docking assembly that aligns and orients the semiconductor component on a printed circuit board (PCB) and that protects the semiconductor component from overloading and mechanical stress from the field replaceable unit. Since mechanical stress can lead to failure of the semiconductor component the present invention may advantageously improve component reliability.

Existing semiconductor component packaging systems have not been able to adequately dissipate heat from semiconductor components, which require increasingly larger heat sinks, without risking damage to the area grid array and without risking mechanical overloading on the semiconductor component. Existing packaging systems, which require separate addition of the heat sink to the system instead of treating the semiconductor component and the heat sink as one unit, may also subject semiconductor components to risk when maintenance of the components such as removal and addition of the semiconductor components is required. Further, by treating the heat sink and the semiconductor component separately, existing packaging systems limit the possibility of creating clean, optimal thermal interface connections when either the heat sink or the semiconductor component must be replaced outside of a controlled manufacturing environment.

Since existing packaging systems treat the semiconductor package and the heat sink as separate components, existing packaging systems cannot fully test the semiconductor package and the heat sink until they are assembled which may occur outside of the controlled manufacturing environment.

The present invention includes a heat sink and semiconductor component assembly, that act as one unit by mounting a heat sink directly on a semiconductor component, that may advantageously behave as a handle for use in its own replacement, and that may be packaged in a field replaceable unit (FRU). The present invention may also include a mounting assembly that includes an anchor bracket docking assembly, and which may provide support, alignment, and orientation for the field replaceable unit. Further, the mounting assembly may optionally include a bolster plate that is attached to the PCB and may provide stability to the PCB. The present invention may sandwich the PCB between the docking assembly and the bolster plate and thereby may enhance the rigidity and the stability of the PCB. The term bolster plate herein refers to a sheet that provides stability and support for the PCB when loaded and may be shaped in a variety of ways. For instance, the bolster plate may have a cavity or may have a shape similar to the anchor bracket docking assembly.

It will be appreciated that the anchor bracket docking assembly may be made of metal, metal coated plastic, or metal impregnated plastic when EMI containment is required. When the anchor bracket docking assembly includes metal in its composition the anchor bracket assembly may, by its attachment to the heat sink, by its mounting on a printed circuit board, and by its connection by electromagnetic interference (EMI) attenuating gaskets also render the necessary EMI containment for the area grid array and the semiconductor component. Occasionally, the bolster plate may also be used to reduce unnecessary EMI.

The semiconductor component may be packaged to ensure that the heat sink and the semiconductor component fit tightly with an optimal thermal interface. In the preferred embodiment, the semiconductor component may be surrounded by edges of a perimeter clamp, and the semiconductor component may be designed with an overhang on the lid of the semiconductor component. The surrounding edges more particularly, may attach to the semiconductor component and create a surface with the semiconductor component lid, by advantageously recessing the perimeter clamp edges and fitting the recessed edges into the semiconductor component lid overhang. The tight fit created by the connection between the perimeter clamp and the semiconductor component may protect the semiconductor component and ensure a tight thermal interface between the heat sink and the semiconductor component. Further, by the tight fit between the perimeter clamp and the semiconductor component, the semiconductor component may be secured in position in the FRU. In alternative embodiments the semiconductor component lid may not require an overhang to create the surface or to create the tight thermal interface.

In the preferred embodiment of the present invention, by employing alignment surfaces on the perimeter clamp and the anchor bracket, the perimeter clamp may be positioned to cooperate with the anchor bracket docking assembly and thereby may align and orient the semiconductor component to easily connect the area grid array to a connector on the printed circuit board. The mating of a first alignment surface on the perimeter clamp to a second alignment surface on the anchor bracket enables the correct positioning and orientation of the semiconductor component, or VLSI package, on the printed circuit board by aligning the VLSI package to successfully insert the area grid array into the connector on the printed circuit board. In an alternative embodiment, the heat sink may have alignment surfaces that mate with the anchor bracket alignment surfaces to ensure the correct alignment and orientation of the semiconductor component and thereby to properly position and orient the area grid array above the connector on the printed circuit board. Attachment of the heat sink to the anchor bracket may provide the mechanical advantage necessary to insert the area grid array into the connector. Both during insertion and removal as well as after the semiconductor component is connected to the printed circuit board, the cooperation of the perimeter clamp with the anchor bracket may isolate FRU mechanical load away from both the area grid array and the semiconductor component to ensure a reliable operation of both.

In the following detailed description and in the several figures of the drawings, like elements are identified with like reference numerals.

The present invention may include an FRU unit and a mounting assembly. A side view of the preferred embodiment of the present invention just prior to insertion of the FRU into the anchor bracket and the printed circuit board is shown in FIG. 1. The present invention may advantageously employ an FRU 20 that includes a heat sink 1 that may include fins 2 and that is attached to a perimeter clamp 9. The FRU 20 may connect to a mounting assembly 18. The mounting assembly 18 may include an anchor bracket docking assembly 13 that is connected to a printed circuit board 15. The anchor bracket docking assembly 13 is positioned on the printed circuit board 15 to ensure proper insertion of the FRU 20 into the mounting assembly 18. The anchor bracket docking assembly 13 may add rigidity and stability to the printed circuit board 15. In the preferred embodiment of the present invention, the mounting assembly 18 may include a bolster plate 16 that is located on the side of the printed circuit board 15 opposite to the side of the printed circuit board 15 attached to the anchor bracket docking assembly 13. The bolster plate 16 may provide rigidity and support to the printed circuit board 15. The printed circuit board may therefore be sandwiched between the bolster plate 16 and the anchor bracket docking assembly 13 and may thereby achieve greater stability by the support from both the bolster plate 16 and the anchor bracket docking assembly 13.

The present invention is an FRU for mounting a heat sink directly on a semiconductor component such as a VLSI package. The FRU is adapted to position the heat sink and the VLSI package for optimal thermal interface. In the preferred embodiment of the present invention as shown in an exploded view in FIG. 2, the FRU 20 (as shown in FIG. 1) includes a heat sink 1 that may include fins 2 and that is positioned on top of a VLSI package 3. It will be appreciated that the VLSI package 3 may be a central processing unit (CPU) component. The FRU 20 also includes a perimeter clamp 9 that is attached to the heat sink 1 by attachment devices such as perimeter clamp screws. It will be appreciated that the use of the terms VLSI package and semiconductor component herein include any type of very large scale integration (VLSI) semiconductor die package that provides input and output terminals for the included VLSI chips, and that can be variably interfaced to a printed circuit board surface input and output array.

The electrical contacts of semiconductor components that may be plugged into a printed circuit board 15 surface may include a ball grid array (BGA) design, a pin grid array (PGA) design, or a land grid array (LGA) design and are generally known as area grid arrays 7. Typically, a pin grid array employs a socket-style connector assembly with the PCB 15. Also, typically the land grid array may implement a compression assembly technique in which an interposer is sandwiched between the LGA of the VLSI package 3 and the LGA of the PCB 15. It will be appreciated that the term connector herein refers to any assembly apparatus or technique in which an area grid array 7 is electrically interfaced to a component on the printed circuit board 15 surface. Therefore, according to the present invention, the area grid array 7 may be connected to a printed circuit board 15 via a connector 11. In the preferred embodiment of the present invention, the housing of the VLSI package includes a lid 5 and the bottom of the VLSI lid 5 is attached to the area grid array 7.

As further illustrated in FIG. 2, the present invention may also include a mounting assembly 18 (as shown in FIG. 1) that may include an anchor bracket docking assembly 13 that may be mounted on one side of the printed circuit board 15. After proper positioning and orienting has occurred, the anchor bracket docking assembly 13 is connected to the heat sink 1 by mechanical attachment devices such as screws 17. The screws 17 can provide the mechanical advantage to overcome the insertion forces necessary to connect the area grid array 7 into the connector 11. The anchor bracket docking assembly 13 provides stability for the FRU 20 docking, offloads mechanical stress from the FRU 20 by its attachment to the heat sink 1 and the printed circuit board 15, and may provide EMI containment for the VLSI package 3 and the area grid array 7.

A first alignment surface, the perimeter clamp alignment surface 8, cooperates with a second alignment surface, the anchor bracket alignment surface 12, to position and orient the area grid array 7 above the connector 11 for easy connection to the printed circuit board 15.

In the preferred embodiment of the present invention and as further shown in FIG. 2, the VLSI package 3 according to the present invention may be advantageously designed to fit in the FRU 20. This allows the perimeter clamp 9 to protect the pins of the area grid array 7 from damage during shipping and handling of the FRU 20.

In addition, the VLSI package 3 may be mounted on the perimeter clamp 9 thus creating a proper thermal interface between the heat sink 1 and the VLSI package 3. For instance, the VLSI lid 5 may be layered on a substrate base 201, and the VLSI lid 5 may overhang the substrate base 201 around the substrate base perimeter forming a lip 203. Typically, the attachment of the leads on the VLSI package 3 to the substrate 201 may be made by wire bond assembly or flip chip assembly. The lip 203 may ensure effective assembly of the VLSI package 3 with the perimeter clamp 9 by allowing the lip 203 to rest on the perimeter clamp 9. The clamping load due to the mounting of the VLSI package 3 on the perimeter clamp 9 is applied only to the lid and is not born by the electronic component, or substrate, on the VLSI package thus protecting the interface between the substrate and the electronic component.

More particularly, the perimeter clamp edges 10 may be recessed and in the present invention may be fitted to the bottom of the VLSI package lid 5 and thereby may create a surface with the top of the VLSI package lid 5, and the surface may be flush within tolerance levels. The smooth surface which may be created by the VLSI lid 5 and the perimeter clamp 9 may enable proper thermal interface between the VLSI package 3 and the heat sink 1.

The anchor bracket docking assembly 13 as further shown in FIG. 2 and according to the preferred embodiment of the present invention is an element of the mounting assembly 18 and cooperates with the FRU 20. In the preferred embodiment of the present invention the anchor bracket docking assembly 13 may be mounted on the printed circuit board 15 and when the FRU 20 is installed, the heat sink 1 may be attached to the anchor bracket docking assembly 13. The controlled process of mounting the anchor bracket docking assembly 13 in a manufacturing environment ensures both a proper alignment of the anchor bracket docking assembly 13 and the connector 11 on the printed circuit board 15.

The anchor bracket docking assembly 13 may provide EMI containment for the VLSI package 3 and the area grid array 7. By including metal in the anchor bracket docking assembly 13, and by connecting the anchor bracket docking assembly 13 to the printed circuit board 15 in a controlled manufacturing environment, a tighter EMI seal between the anchor bracket docking assembly 13 and the printed circuit board 15 can be achieved. The anchor bracket docking assembly 13 may be connected to the printed circuit board 15 by screws and subsequently the heat sink 1 of the FRU 20 may also be connected to the anchor bracket docking assembly 13 by screws 17. It will be appreciated that the anchor bracket docking assembly 13 must be assembled to the printed circuit board 15 and then to the heat sink 1. In an alternative embodiment for greater strain relief the heat sink 1 may be attached to the anchor bracket docking assembly 13 and the anchor bracket docking assembly 13 may be attached to the bolster plate 16 ensuring that the load from the heat sink 1 is not born by the electrical components, such as the VLSI package 3, but is passed through to the mounting assembly 18 (as shown in FIG. 1).

As shown in more detail in FIG. 3, the perimeter clamp 9 is attached to the heat sink 1, and is located between the heat sink 1 and the printed circuit board 15. The perimeter clamp 9 includes an alignment surface 8 that mates with an alignment surface 12 on the anchor bracket docking assembly 13 before insertion of the pins into the connector 11, and the mating ensures proper alignment of the area grid array 7 to the connector 11 on the printed circuit board 15. The proper function of the perimeter clamp alignment surface 8 is achieved by controlling the position of the perimeter clamp alignment surface 8 with respect to the area grid array 7. Similarly the proper function of the anchor bracket alignment surface 12 is achieved by controlling the position of the anchor bracket alignment surface 12 with respect to the connector 11 on the printed circuit board 15. The proper position of the perimeter clamp alignment surface 8 and the anchor bracket alignment surface 12, ensures that their mating in turn will ensure the proper positioning and orientation of the area grid array 7 above the connector 11 on the printed circuit board 15 in order to prevent bending of the pins on the area grid array 7. When the area grid array 7 is more particularly a pin grid array, the perimeter clamp alignment surface 8 and the anchor bracket alignment surface 12 may be parallel to the area grid array 7, when the area grid array 7 is positioned to fit into the connector 11 on the printed circuit board 15, to ensure proper alignment of the area grid array 7 with the connector 11 on the printed circuit board 15. It will be appreciated that pins or other attachment devices could be employed instead of the perimeter clamp alignment surface 8 and the anchor bracket alignment surface 12 to ensure proper alignment of the area grid array 7 with the connectors 11 on the printed circuit board 15. It will be further appreciated that elements of the FRU 20 other than the perimeter clamp 9, such as the heat sink 1, may include an alignment surface that may mate with the anchor bracket alignment surface 12 to ensure suitable orientation and location of the area grid array 7 on the connector 11 on the printed circuit board 15. For instance, a pair of pins on the printed circuit board 15 may mate with corresponding holes on the heat sink 1 to orient and position the area grid array 7 on the connector 11 on the printed circuit board 15. It will also be appreciated by those skilled in the art that the perimeter clamp 9 and the VLSI package 3 may alternatively be mounted on an evaporator of a heat pipe assembly that may in turn be attached to heat fins 2. In another alternative, the perimeter clamp 9 and the VLSI package 3 may be mounted on a non-thermal frame.

By assembling the perimeter clamp 9 in the FRU 20 (as shown in FIG. 1) in the manufacturing environment, a tight locational tolerance may be achieved between the area grid array 7 and the connectors 11 on the printed circuit board 15 by optimally locating the perimeter clamp 9 to ensure the best cooperative fit between the perimeter clamp 9 and the VLSI package 3. In the preferred embodiment, the heat sink 1 is attached on one side to heat fins 2 that may dissipate heat from the VLSI package 3, and the printed circuit board 15 may be attached to a bolster plate 16 to increase the rigidity of the printed circuit board 15.

In the preferred embodiment of the present invention, as shown in FIG. 4, the FRU 20 (as shown in FIG. 1) that includes the heat sink 1 here shown with fins 2 may be attached to the anchor bracket docking assembly 13 by screws 17. The cooperation of the perimeter clamp 9 with the anchor bracket docking assembly 13 may align by the anchor bracket alignment surface 12 the area grid array 7 of the VLSI package 3 for easy connection to the printed circuit board 15 (as shown in FIG. 1) via the connectors 11 (shown in FIG. 2).

As shown in FIG. 5 and according to the present invention, the design of the FRU 20 that locates the heat sink 1 attached to the perimeter clamp 9 by perimeter clamp screws 21 forming an FRU 20 housing that provides protection and ease of maintenance for the VLSI package 3 and the area grid array 7. Additionally, the compact fit of the anchor bracket docking assembly 13 (shown in FIG. 2) and the perimeter clamp 9 advantageously positions the FRU 20 to function as a handle and to enable precise alignment for the FRU's 20 insertion and removal. That is, the FRU 20 may function as a handle to ensure that the area grid array 7 is seated in the connectors 11 (as shown in FIG. 2) on the printed circuit board 15 (as shown in FIG. 2) without damage to the VLSI package 3 or the area grid array 7. Therefore when the FRU 20 is replaced outside of the manufacturing environment it only must be connected to the anchor bracket docking assembly 13 by screws 17, advantageously aligning the VLSI package 3 and the area grid array 7 on the printed circuit board 15 as a by-product of connecting the FRU 20 to the anchor bracket docking assembly 13. It will be appreciated that the FRU 20 may alternatively be created by a frame 19, such as a non-thermal component, that attaches to the VLSI package 3 and that may house the heat sink 1 that may include fins 2.

As further shown in FIG. 5, in the preferred embodiment of the present invention, the perimeter clamp 9 has edges 10 which form a cavity that surrounds and protects the VLSI package 3 from damage due to handling or conditions which may cause stress or movement on the area grid array 7 or the VLSI package 3. The inside cavity formed by the perimeter clamp edges 10 also helps to position the VLSI package 3 for successful orientation of the area grid array 7 above the corresponding connector 11 on the printed circuit board 15.

In view of the foregoing it will be appreciated that the present invention is embodied in a novel package that creates an FRU by mounting a heat sink on a semiconductor component. According to the present invention, the heat sink and semiconductor component assembly act as one unit and may behave as a handle for use in its own replacement. The mounting assembly includes an anchor bracket docking assembly that aligns and orients the semiconductor component on a PCB and that protects the semiconductor component from mechanical stress from the field replaceable unit. The mounting assembly may also include a bolster plate that is attached to the PCB to provide stability to the PCB. It will be appreciated that when the anchor bracket docking assembly includes metal in its composition the anchor bracket docking assembly may render the necessary EMI containment for the area grid array and the semiconductor component.

In the preferred embodiment, the semiconductor component may be surrounded by edges of a perimeter clamp and the edges may create a surface with the semiconductor component lid, by advantageously recessing the perimeter clamp edges and fitting the recessed edges into the semiconductor component lid overhang. The perimeter clamp and the anchor bracket docking assembly may have alignment surfaces that cooperate and thereby align and orient the semiconductor component to easily connect the area grid array to the printed circuit board via connectors.

Although a preferred embodiment of the invention has been described and illustrated, the invention is not to be limited to the specific forms or arrangements of parts so described and illustrated. The invention is limited only by the claims.

What is claimed is:

1. A computer field replaceable unit apparatus having a VLSI package, said computer having a printed circuit board, said printed circuit board having a connector and being attached to an anchor bracket docking assembly, said anchor bracket docking assembly having an alignment surface at a pre-determined position with respect to said connector on said printed circuit board and being mounted to said printed circuit board, said field replaceable unit apparatus comprising:

a heat sink for dissipating heat from said VLSI package;

a substrate base included in said VLSI package, said substrate base having a perimeter;

a lid included in said VLSI package that overhangs said perimeter of said substrate base;

an electrical grid terminal included in said VLSI package for connection with said connector on said printed circuit board;

a perimeter clamp having a recessed edge that forms a cavity and surrounds said VLSI package and said perimeter clamp recessed edge fits with said overhanging VLSI package lid thereby protecting said VLSI package, said perimeter clamp being screwed to said heat sink thereby creating a thermal interface between said VLSI package and said heat sink;

an alignment surface of said perimeter clamp that mates with said alignment surface of said anchor bracket docking assembly to position said VLSI package for connection of said electrical grid terminal on said VLSI package with said connector on said printed circuit board; and said heat sink being attached to said anchor bracket docking assembly thereby mounting said VLSI package on said printed circuit board and connecting said electrical grid terminal of said VLSI package to said connector on said printed circuit board.

2. A field replaceable unit apparatus as set forth in claim 1 wherein said apparatus acts as a handle for insertion and removal of said apparatus.

3. A field replaceable unit apparatus as set forth in claim 1 wherein said apparatus further comprising, said perimeter clamp recessed edge fitting with said overhanging VLSI package lid so that mechanical load on said VLSI package due to said perimeter clamp is minimized.

4. A computer field replaceable unit apparatus having a VLSI package, said computer having a printed circuit board, said printed circuit board having a connector and being attached to an anchor bracket docking assembly, said anchor bracket docking assembly having an alignment surface at a pre-determined position with respect to said connector on said printed circuit board and being mounted to said printed circuit board, said field replaceable unit apparatus comprising:

a frame for mounting said VLSI package;

a substrate base included in said VLSI package, said substrate base having a perimeter;

a lid included in said VLSI package that overhangs said perimeter of said substrate base;

an electrical grid terminal included in said VLSI package for connection with said connector on said printed circuit board;

a perimeter clamp having a recessed edge that forms a cavity and surrounds said VLSI package and said recessed edge fitting with said overhanging VLSI package lid thereby protecting said VLSI package, said perimeter clamp being screwed to said frame thereby supporting said VLSI package;

an alignment surface of said perimeter clamp that mates with said alignment surface of said anchor bracket docking assembly to position said VLSI package for connection of said electrical grid terminal on said VLSI package with said connector on said printed circuit board; and said frame being attached to said anchor bracket docking assembly thereby mounting said VLSI package on said printed circuit board and connecting said electrical grid terminal of said VLSI package to said connector on said printed circuit board.

5. The apparatus as set forth in claim 4, wherein said frame further comprises a heat sink thereby creating a thermal interface between said VLSI package and said heat sink.

6. The apparatus as set forth in claim 4, wherein said frame acts as a handle for insertion and removal of said frame.

7. A computer implemented method for mounting a VLSI package on a printed circuit board, said computer having a printed circuit board, said printed circuit board having a connector and being attached to an anchor bracket docking assembly, said anchor bracket docking assembly having an alignment surface at a pre-determined position with respect to said connector on said printed circuit board and being mounted to said printed circuit board, said method comprising:

including a heat sink for dissipating heat from said VLSI package;

including a substrate base and a lid in said VLSI package;

overhanging said lid of said substrate base around a perimeter of said substrate base;

enabling connection of said connector on said printed circuit board by including an electrical grid terminal on said VLSI package;

surrounding said VLSI package with a cavity formed by a perimeter clamp having an edge;

recessing said edge of said perimeter clamp and fitting said overhanging VLSI package lid with said recessed edge thereby protecting said VLSI package;

mounting said VLSI package to said heat sink by screwing said perimeter clamp to said heat sink thereby creating a thermal interface between said VLSI package and said heat sink;

establishing an alignment surface on said perimeter clamp that mates with said alignment surface of said anchor bracket docking assembly thereby positioning said VLSI package for connection of said electrical grid terminal on said VLSI package with said connector on said printed circuit board; and attaching said heat sink to said anchor bracket docking assembly thereby mounting said VLSI package on said printed circuit board and connecting said electrical grid terminal of said VLSI package to said connector on said printed circuit board.

8. The method as set forth in claim 7, further comprising using said field replaceable unit as a handle for insertion and removal of said field replaceable unit.

* * * * *